United States Patent
Moeneclaey et al.

(10) Patent No.: US 9,807,334 B1
(45) Date of Patent: Oct. 31, 2017

(54) ANALOG TO DIGITAL CONVERSION WITH ENHANCED PRECISION

(71) Applicant: STMicroelectronics (Grenoble 2) SAS, Grenoble (FR)

(72) Inventors: Nicolas Moeneclaey, Vourey (FR); Tarek Lule, Saint-Egreve (FR); Alexis Marcellin, Varces (FR)

(73) Assignee: STMicoelectronics (Grenoble 2) SAS, Grenoble (FR)

(*) Notice: Subject to any disclaimer, the term of this patent is extended or adjusted under 35 U.S.C. 154(b) by 0 days.

(21) Appl. No.: 15/492,139

(22) Filed: Apr. 20, 2017

(30) Foreign Application Priority Data

Oct. 13, 2016 (FR) .................... 16 59885

(51) Int. Cl.
*H03M 1/56* (2006.01)
*H04N 5/378* (2011.01)
*H04N 5/217* (2011.01)
*H03M 1/12* (2006.01)
*H03M 1/00* (2006.01)
*H04N 3/14* (2006.01)
*H04N 5/335* (2011.01)

(52) U.S. Cl.
CPC ............. *H04N 5/378* (2013.01); *H03M 1/56* (2013.01); *H03M 1/00* (2013.01); *H03M 1/12* (2013.01); *H04N 3/155* (2013.01); *H04N 5/2173* (2013.01); *H04N 5/335* (2013.01)

(58) Field of Classification Search
CPC .... H03M 1/56; H03M 1/00; H03M 1/12; H04N 5/2173; H04N 3/155; H04N 5/335
USPC ......... 341/169, 164, 155; 348/250, 308, 294
See application file for complete search history.

(56) References Cited

U.S. PATENT DOCUMENTS

| 2012/0154649 | A1* | 6/2012 | Itzhak .................... H03K 21/38 348/294 |
| 2014/0203956 | A1 | 7/2014 | Meynants et al. |
| 2016/0043725 | A1 | 2/2016 | Lee et al. |

\* cited by examiner

*Primary Examiner* — Joseph Lauture
(74) *Attorney, Agent, or Firm* — Slater Matsil, LLP (57) ABSTRACT

A device for conversion of an analog signal into a digital signal includes a clock signal generator and a ramp generator configured for delivering a rising voltage ramp. A comparator is configured for comparing the value of the analog signal and the value of the voltage ramp and for generating a comparison signal taking a first logical value when the two values are equal. A signal generator is configured for generating a counter signal equal to the inverse of the clock signal if the comparison signal takes its first value while the clock signal is in the high state, or a counter signal equal to the clock signal if the clock signal is in the low state. A counter is configured for counting the number of edges of the counter signal.

20 Claims, 4 Drawing Sheets

ANALOG TO DIGITAL CONVERSION WITH ENHANCED PRECISION

CROSS-REFERENCE TO RELATED APPLICATIONS

This application claims priority to French Patent Application No. 1659885, filed on Oct. 13, 2016, which application is hereby incorporated herein by reference.

TECHNICAL FIELD

Various embodiments of the invention and their implementation relate to analog-digital conversion, and more particularly, the improvement in the precision of analog-digital converters.

BACKGROUND

An analog-digital converter is an electronic circuit allowing an analog signal, for example, an electrical voltage, to be converted into a digital signal coded over one or more bits.

In order to convert an analog signal into a digital signal, one solution consists in generating a voltage ramp (for example, a rising voltage ramp) by means of a digital-analog converter whose dynamic range is known, starting a counter when the value of the voltage ramp is equal to the value of the analog signal, and stopping the counter when the ramp reaches its maximum value.

In order to obtain the value of the digital signal, the counter may for example, be configured for counting down from an initial value corresponding to the maximum value of the ramp. The value of the counter when it is stopped then represents the value of the analog signal.

Figure 1:
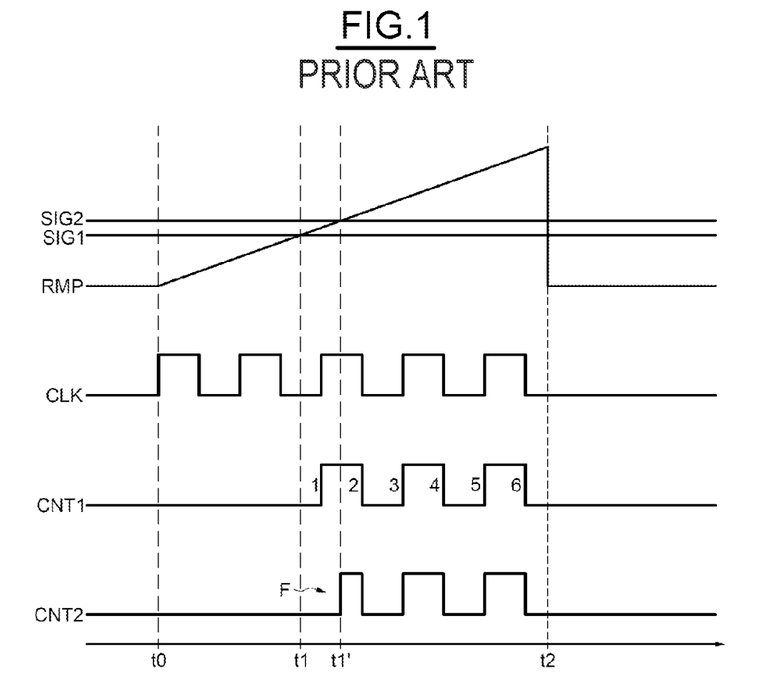
FIG. 1, previously described, illustrates the prior art.

FIG. 1 illustrates a timing diagram representing two possible time variations of the counter during an analog-digital conversion conforming to this solution.

The analog-digital conversion here is timed by a clock signal CLK.

At an initial time t0, a voltage ramp RMP is generated and a first analog signal SIG1 to be converted is acquired.

At a first time t1, the value of the first analog signal SIG1 and the value of the ramp are equal. A first counter signal CNT1 equal to the clock signal CLK is then generated.

At a second time t2, the ramp RMP reaches its maximum value, hence the conversion is halted and the signals RMP, CLK and CNT1 go into the low state.

The counter signal CNT1 is delivered to an asynchronous counter. The value of the least significant bit varies at the cadence of the edges of the signal CNT1. Thus, the value of the digital signal is equal to the number of edges of the first counter signal CNT1.

Moreover, since the counter signal CNT1 is equal to the clock signal CLK between the times t1 and t2, the digital value of the analog signal SIG1 is indeed equal to the number of edges of the clock signal having occurred between the first time t1 and the second time t2, in other words here six.

However, if the same process is carried out with a second analog signal SIG2 whose value differs slightly from that of the first signal, in other words here with a signal SIG2 whose value is very slightly higher than the value of the first signal SIG1, the equality of the second signal and the ramp occurs a little later, at a third time t1'.

A second counter signal CNT2 equal to the clock signal CLK is generated, and as the equality has occurred during a high state of the clock signal CLK, the counter CNT2 begins with an additional rising edge F.

Thus, between the times t1' and t2, the number of edges of the clock signal CLK is less than the number of edges of the second counter signal CNT2. The digital value will not therefore be representative of the analog signal because it will not be equal to the number of edges of the clock signal having taken place between the time t1' and t2.

In other words, owing to the additional rising edge F generated by the counter when the equality occurs during a high state of the clock, the counter is only able to count in two's. The value of the least significant bit of the digital value is therefore not significant.

One solution would consist in not taking into account the least significant bit. However, this divides the rate of the counter by two, and hence requires a clock generator with twice the frequency to compensate for this.

SUMMARY

Thus, according to one embodiment, an analog-digital conversion method is provided that is precise and requires simple circuitry.

According to one aspect, a method is provided for analog-digital conversion of an analog signal into a digital signal. A clock signal is generated and at least one rising voltage ramp is generated. The value of the analog signal is compared with the value of the at least one voltage ramp. When the two values are equal, a counter signal is generated equal to the inverse of the clock signal if the clock signal is in the high state, or equal to the clock signal if the clock signal is in the low state. The number of edges of the counter signal is counted in order to obtain a value of the digital signal.

Thus, by inverting the counter signal when the equality takes place during a high state of the clock signal, the presence of an additional rising edge is avoided which would falsify the digital value.

According to another aspect, an analog-digital device comprises a generator configured for generating a clock signal. A ramp generator is configured for delivering at least one voltage ramp with an increasing value. A comparator configured for comparing the value of the at least one analog signal and the value of the at least one voltage ramp and for generating a comparison signal taking a first logical value when the two values are equal. A signal generator is configured to generate a counter signal equal to the inverse of the clock signal if the comparison signal takes its first value while the clock signal is in the high state, and to generate a signal equal to the clock signal if the comparison signal takes its first value when the clock signal is in the low state. A counter is configured for counting the number of edges of the counter signal.

According to one embodiment of this other aspect, the signal generator comprises a controller configured for generating a first control signal equal to the comparison signal and a second control signal equal to the inverse of the comparison signal, a first latch whose data input is designed to receive the clock signal and whose control input is designed to receive the first control signal, an EXCLUSIVE OR gate whose inputs are coupled to the output of the first latch and to the clock generator signal, and a second latch whose data input is coupled to the output of the EXCLUSIVE OR gate and whose control input is coupled to the controller so as to receive the second control signal, and whose output is coupled to the counter.

The controller may comprise the comparator and an inverter, the output of the comparator being coupled to the control input of the first latch and to the input of the inverter, and the output of the inverter is coupled to the control input of the second latch.

According to another embodiment compatible with correlated double sampling (or CDS), the ramp generator may be configured for generating a first ramp and a second ramp, and in this case the controller furthermore comprises a NAND logic gate, and a ramp detector configured for generating a signal having a high state during the generation of the first ramp.

The input of the inverter is coupled to the output of the comparator; the output of the inverter is coupled to a first input of the NAND gate and to the control input of the second latch.

A second input of the NAND gate is coupled to the output of the ramp detector and the output of the NAND gate is coupled to the control input of the first latch.

The counter may be an asynchronous counter.

According to another aspect, a system is provided that comprises an image sensor comprising a matrix of pixels, each column of pixels being connected to a charge transfer circuit configured for transferring the signal from each pixel of the column of pixels to a conversion device such as previously defined.

The system may comprise a digital camera or an intelligent mobile communications device incorporating such an image sensor.

BRIEF DESCRIPTION OF THE DRAWINGS

Other advantages and features of the invention will become apparent upon examining the detailed description of embodiments and their implementation, which are in no way limiting, and from the appended drawings in which.

DETAILED DESCRIPTION OF ILLUSTRATIVE EMBODIMENTS

Figure 2:
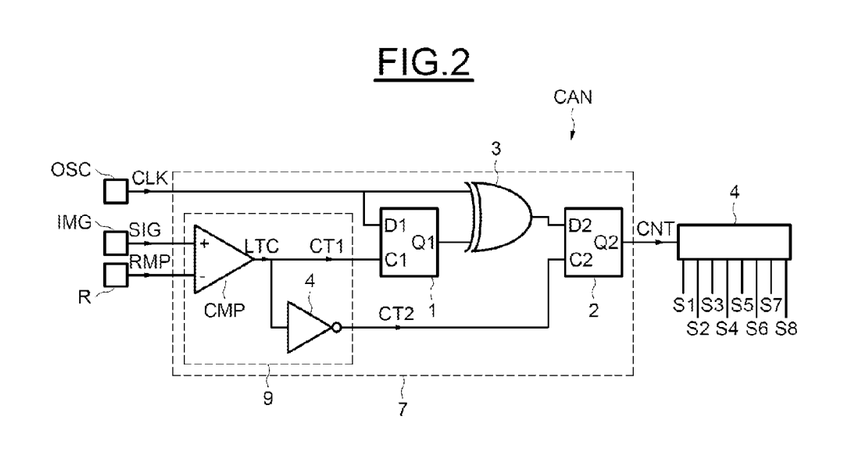
FIGS. 2 to 7 illustrate embodiments of the invention and their implementation.

FIG. 2 illustrates schematically from a logic point of view one example of an analog-digital converter CAN according to one embodiment of the invention.

The analog-digital converter CAN is here coupled to an imager circuit IMG, configured for delivering an analog signal SIG to be converted, and to a clock generator signal OSC which is configured for timing the operations implemented by the converter.

The imager circuit here, for example, comprises a matrix of photodiodes each pixel of which is coupled to a charge transfer circuit.

The clock generator signal OSC here comprises a piezoelectric quartz oscillator associated with a phase-locked loop, and is configured for delivering a clock signal CLK having, for example, a frequency of 400 MHz.

The converter CAN comprises a ramp generator R, configured for delivering a rising voltage ramp, and signal generator 7 configured for generating a counter signal CNT and coupled to an asynchronous counter 5.

The signal generator 7 comprises a controller 9, comprising a comparator amplifier CMP and an inverter 4, and which are configured for generating a first control signal CT1 and a second control signal CT2.

The inverting input of the comparator CMP is coupled to the voltage ramp generator R, and the non-inverting input of the comparator CMP is coupled to the charge transfer circuit of the imager circuit IMG (not shown for the sake of simplification).

The comparator amplifier CMP is configured for delivering a comparison signal LTC having a high state if the value of its inverting input is higher than or equal to the value of its non-inverting input, and a low state in the opposite case. Here, the first control signal CT1 is the comparison signal LTC.

The input of the inverter 4 is coupled to the output of the comparator CMP. The inverter delivers the second control signal CT2 at its output, equal to the inverse of the comparison signal LTC and hence of the first control signal CT1.

The signal generator 7 furthermore comprise a first flip-flop D1 and a second flip-flop D2 of the latch type, and a logic gate 3 of the "EXCLUSIVE OR" type, commonly denoted by those skilled in the art using the term "XOR gate".

A flip-flop D of the latch type conventionally comprises a data input and a control input, and is configured for copying the state of the data input onto its output if the control input is in the low state, and for storing the state of the data input on its output when the control input goes into the high state.

The data input D1 of the first flip-flop 1, or first latch 1, is here coupled to the clock generator signal OSC, and the control input C1 of the first latch 1 is coupled to the output of the comparator CMP, and is hence designed to receive the first control signal CT1. The output of the first latch 1 is denoted by the reference Q1.

A first input of the EXCLUSIVE OR gate 3 is coupled to the oscillator OSC, and a second input of the EXCLUSIVE OR gate 3 is coupled to the output Q1 of the first latch 1.

The data input D2 of the second latch 2 is coupled to the output of the EXCLUSIVE OR gate 3, and the control input C2 is coupled to the output of the inverter 4.

The output Q2 of the second latch 2 is configured for delivering the counter signal CNT and is coupled to the input of the asynchronous counter 5.

The asynchronous counter 5 here is configured for counting the number of edges of the counter signal CNT, and for delivering the result in the form of a binary value here coded over eight bits. Thus, the asynchronous counter 5 here comprises eight outputs S1 to S8, whose first output S1 represents the least significant bit of the binary value and whose output S8 represents the most-significant bit.

The value of the least significant bit S1 varies at the cadence of the edges of the signal CNT.

The data input D2 of the second latch 2 is coupled to the output of the EXCLUSIVE OR gate 3, and its control input C2 is coupled to the output of the inverter 4 so as to receive the second control signal CT2, here the inverse of the signal CT1, on its control input C2.

Figure 3:
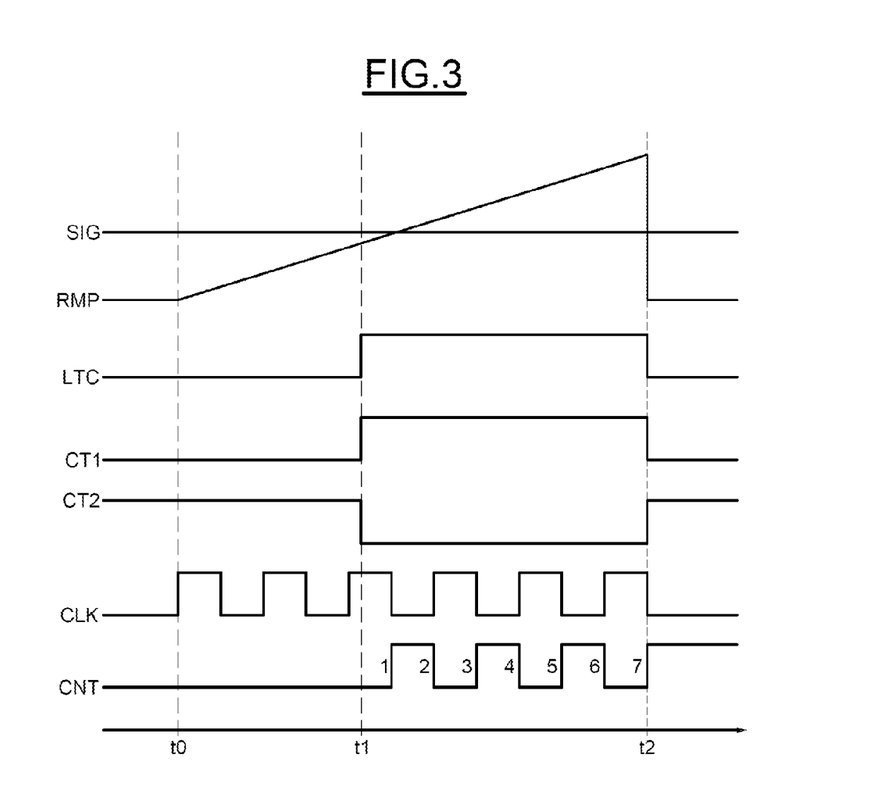

FIG. 3 is a timing diagram showing the time variation of the signals of the converter CAN as a function of time.

On the timing diagram in FIG. 3, the initial time t0 denotes the start of the conversion process, hence the initiation of the converter CAN. Prior to the initial time t0, all the signals are in the low state.

At the initiation of the converter, the oscillator OSC generates the clock signal CLK, and the ramp generator R generates the rising voltage ramp RMP.

As long as the value of the ramp RMP is less than the analog signal SIG to be converted, the comparison signal LTC at the output of the comparator CMP is in the low state. Hence, the first control signal CT1 is in the low state and the second control signal CT2 is in the high state.

Thus, the control input C1 of the first latch 1 is in the low state, and the first latch therefore transmits, on its output Q1, the clock signal CLK present on its data input.

Since the two inputs of the EXCLUSIVE OR gate 3 are both equal to the clock signal CLK, the output of the EXCLUSIVE OR gate 3 is in the low state.

The input C2 of the second latch 2 is in the high state since it receives the second control signal CT2, and the output Q2 of the second latch 2 is held at the initial state of its data input D2, in other words the low state.

The counter signal CNT does not therefore vary.

When the value of the voltage ramp reaches the value of the analog signal SIG delivered by the imager circuit IMG, here at an intermediate time t1, the comparison signal at the output of the comparator goes into the high state, and hence the first control signal CT1 is in the high state and the second control signal CT2 is in the low state.

Thus, the control input C1 of the first latch 1 goes into the high state, and the control input C2 of the second latch 2 goes into the low state.

At the intermediate time t1, the clock signal CLK, and hence the data input D1 of the first latch 1, are in the high state.

Thus, the output Q1 of the first latch 1 is held in the high state.

Accordingly, the EXCLUSIVE OR gate, which receives at its input the state of the output Q1 of the first latch 1, in other words a high state, and the clock signal, therefore delivers a signal that is the inverse of the clock signal CLK.

The second latch 2, whose control input C2 receives the second control signal CT2 in the low state, delivers at its output Q2 the counter signal CNT equal to the state of its data input D2, in other words the inverse of the clock signal CLK.

The asynchronous counter 5, initialized at an initial value corresponding to the known maximum value of the ramp, will then count down at the cadence of the edges of the signal CNT.

When the ramp RMP reaches its maximum value, at the final time t2, the ramp is reset, the oscillator OSC is stopped, the comparison signal goes into the low state and the counter 5 is stopped.

Thus, even though the equality between the ramp signal RMP and the analog signal SIG occurs on a high state of the clock signal, here the generation of an additional front on the signal CNT is avoided, and the binary value at the output of the asynchronous counter 5 has indeed varied by a number equal to the number of edges of the clock signal between the times t1 and t2, here seven.

Some analog-digital conversion methods, such as correlated double sampling (CDS), require the generation of two successive ramps by the ramp generator R.

Conventionally, a first ramp is generated in order to measure a first value of the analog signal, for example, the noise of the imager circuit, and a second ramp is generated in order to measure a second value of the analog signal, typically the value of illumination of the pixel.

The second value of the signal typically comprises the value of illumination of the pixel but also the noise of the imager circuit. Consequently, the subtraction of the first value from the second value of the analog signal allows a digital value representative of the value of illumination of the pixel to be obtained.

During the generation of the first ramp, the analog-digital conversion can take place in a manner analogous to what has previously been described in relation to FIG. 3, except for the fact that the counter 5 is configured so as to be incremented and may be reset to a value equal to the opposite of the maximum value of the first ramp. Thus, after the generation of the first ramp, the value of the counter 5 is equal to the opposite of the digital value representative of the noise of the imager circuit.

During the generation of the second ramp, the counter continues to be incremented as soon as the second ramp starts, and stops when the value of the second ramp is equal to the value of the second signal. The final value of the counter 5 is then representative of the value of illumination of the pixel.

However, if the structure of the converter illustrated in FIG. 2 were conserved, the reset of the first ramp would result in the comparison signal LTC going into the low state, and hence a modification of the first and second control signals CT1 and CT2.

For this reason, the control input C2 of the second latch 2 would therefore go into a high state and the counter signal CNT would be fixed after the start of the second ramp.

Figure 4:
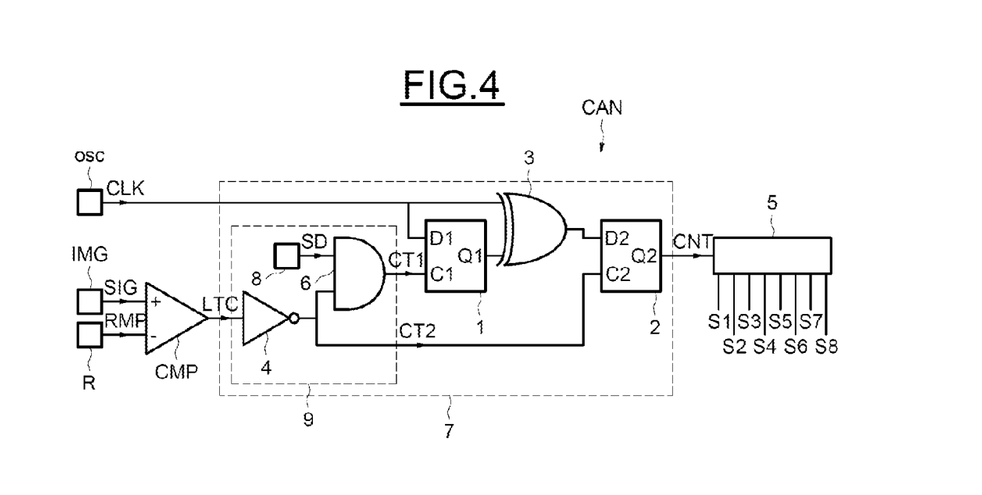
Figure 5:
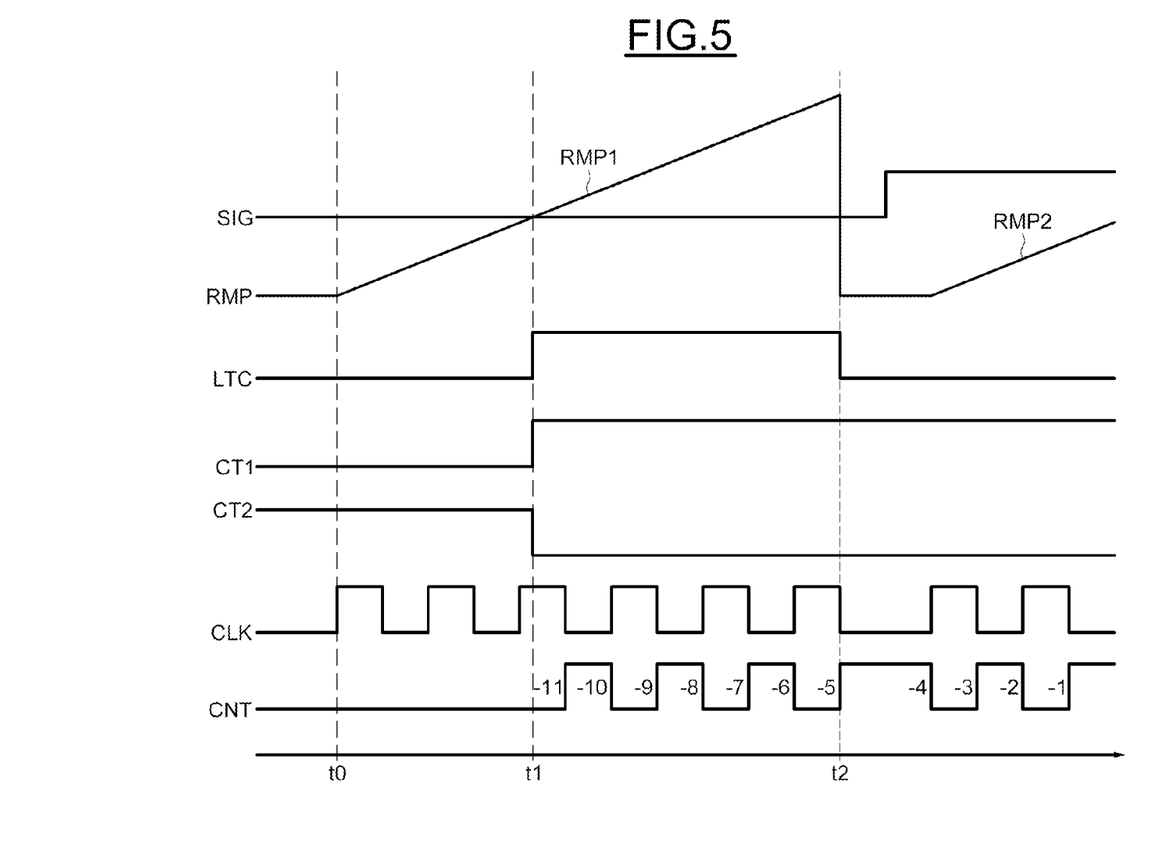

FIGS. 4 and 5 illustrate one embodiment of the invention compatible with correlated double sampling, in other words capable of holding the states of the first control signal CT1 and of the second control signal CT2 after the resetting of the ramp (after the time t2).

In this embodiment, the counter 5 is reset to a value equal to the maximum value of the first ramp, for example, here −12.

In this embodiment, the controller 9 comprises a NAND logic gate 6, a logic circuit for ramp detection 8 cooperating with the ramp generator R and configured for delivering a signal SD having a high state only when the ramp generator R generates the first ramp RMP1, and the inverter 4.

The first control signal CT1 is delivered at the output of the NAND gate 6 and the second control signal CT2 is delivered at the output of the inverter 4.

Here, the output of the inverter 4 is coupled to a first input of the NAND gate 6, and the ramp detector 8 is coupled to a second input of the NAND gate 6.

Thus, just prior to the resetting of the first ramp RMP1, in other words just before the first ramp RMP1 reaches its maximum value, the signal SD is in the high state, and the output of the comparator CMP is in the high state, and hence the output of the inverter 4 is in the low state.

The states of the inputs of the NAND gate are therefore different, and the NAND gate delivers at its output a first control signal CT1 in the high state.

Thus, prior to the resetting of the first ramp RMP1, the values of the control signals CT1 and CT2 do not change with respect to the embodiment previously described in relation to FIGS. 2 and 3.

Then, when the first ramp RMP1 is reset, the comparison signal LTC goes into the low state and hence the output of the inverter 4 goes into the high state, and the ramp detector 8 deliver a signal SD in the low state.

Thus, the inputs of the NAND gate 6 are in different states, and the output of the NAND gate, in other words the first control signal CT1, is indeed therefore held in the high state.

During the generation of a second ramp, the counter signal CNT will re-adopt its time behavior in a synchronous manner with that of the clock signal CLK.

The digital-analog converters previously described and illustrated in FIGS. 2 and 4 may conventionally be coupled to a matrix of pixels MAT of an optical system, such as for example, a digital camera or an intelligent mobile telephone of the 'smartphone' type.

Figure 6:
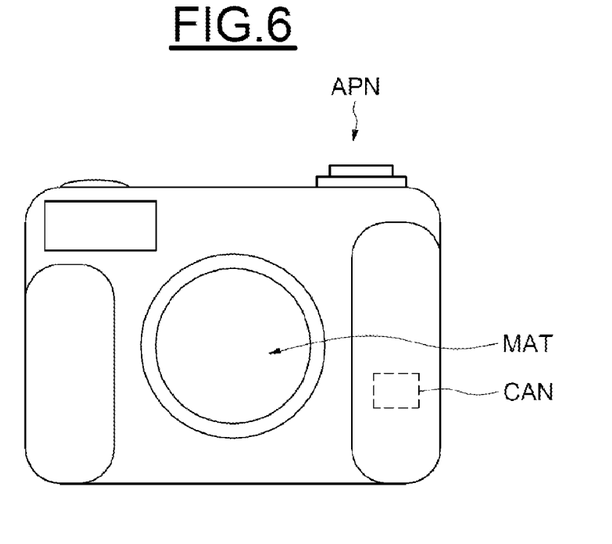
Figure 7:
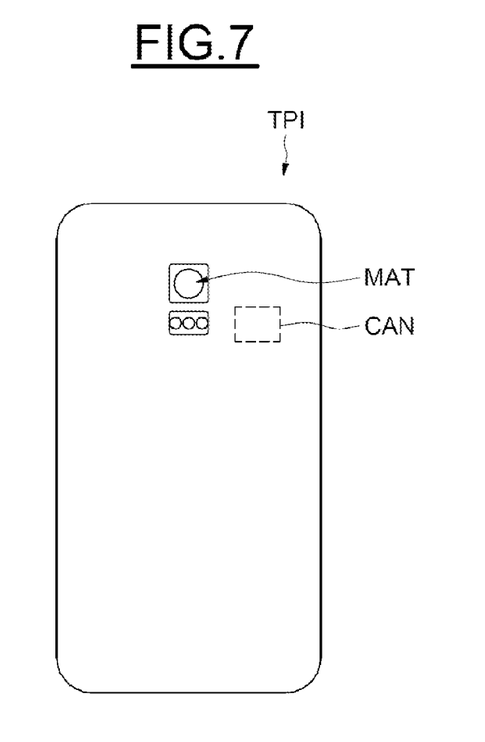

FIGS. 6 and 7 illustrate systems comprising a pixel matrix MAT coupled to analog-digital converters CAN according to one embodiment of the invention.

FIG. 6 illustrates a digital camera APN and FIG. 7 illustrates a smartphone TPI. The camera and the mobile telephone comprise an analog-digital converter CAN according to one embodiment of the invention.

The application examples of the invention are not limited to those illustrated in FIGS. 6 and 7, and those skilled in the art will be able to apply the embodiments of the invention previously described and illustrated in FIGS. 2 to 5 to other known systems.

What is claimed is:

1. A method for analog-digital conversion of an analog signal into a digital signal, the method comprising:
    generating a clock signal;
    generating a rising voltage ramp;
    comparing a value of the analog signal with a value of the voltage ramp,
    when the value of the analog signal and the value of the voltage ramp are equal, generating a counter signal that is equal to the inverse of the clock signal if the clock signal is in a high state, or equal to the clock signal if the clock signal is in a low state; and
    counting a number of edges of the counter signal to obtain a value of the digital signal.

2. The method according to claim 1, wherein generating the counter signal comprises:
    generating a first control signal that is equal to a comparison signal based upon a result of the comparing;
    generating a second control signal that is equal to the inverse of the comparison signal;
    latching the clock signal in response to the first control signal;
    performing an EXCLUSIVE OR operation between the clock signal and the latched first control signal; and
    latching a result of the EXCLUSIVE OR operation in response to the second control signal.

3. The method according to claim 2, wherein counting the number of edges of the counter signal comprises accounting a result of the latching of the result of the EXCLUSIVE OR operation.

4. The method according to claim 1, wherein generating the rising voltage ramp comprises generating a first voltage ramp and a second voltage ramp.

5. A device for analog-digital conversion of an analog signal into a digital signal, the device comprising,
    a clock generator configured to generate a clock signal;
    a ramp generator, configured to deliver a voltage ramp of increasing value;
    a comparator with a first input coupled to a node carrying the analog signal and a second input coupled to an output of the ramp generator, the comparator configured to generate a comparison signal of a first logical value when a value of the voltage ramp is the same as a value of the analog signal;
    a signal generator coupled to an output the comparator and configured to generate a counter signal that is equal to the inverse of the clock signal if the comparison signal transitions to the first logical value while the clock signal is in a high state, and to generate a counter signal equal to the clock signal if the comparison signal transitions to the first logical value when the clock signal is in a low state; and
    a counter coupled to the signal generator to receive the counter signal, the counter configured to count a number of edges of the counter signal.

6. The device according to claim 5, wherein the signal generator comprises:
    a controller configured to generate a first control signal that is equal to the comparison signal and a second control signal that is equal to the inverse of the comparison signal;
    a first latch having a data input coupled to receive the clock signal and a control input coupled to receive the first control signal;
    an EXCLUSIVE OR logic gate having a first input coupled to an output of the first latch and a second input coupled to an output of the clock generator; and
    a second latch having a data input coupled to an output of the EXCLUSIVE OR logic gate and a control input coupled to the controller to receive the second control signal, the second latch having an output coupled to the counter.

7. The device according to claim 6, wherein the controller comprises the comparator and an inverter, the output of the comparator being coupled to the control input of the first latch and to an input of the inverter, and an output of the inverter being coupled to the control input of the second latch.

8. The device according to claim 7, wherein the ramp generator is configured to generate a first ramp and a second ramp, and wherein the controller further comprises a NAND logic gate and ramp detector configured to generate a signal having a high state during generation of the first ramp, the input of the inverter being coupled to the output of the comparator, the output of the inverter being coupled to a first input of the NAND logic gate and to the control input of the second latch, a second input of the NAND logic gate being coupled to the output of the ramp detector and an output of the NAND logic gate being coupled to the control input of the first latch.

9. The device according to claim 5, wherein the counter comprises an asynchronous counter.

10. A device for analog-digital conversion of an analog signal into a digital signal, the device comprising:
    means for generating a clock signal;
    means for generating a rising voltage ramp;
    means for comparing a value of the analog signal with a value of the voltage ramp;
    means for generating a counter signal when the value of the analog signal and the value of the voltage ramp are equal, the counter signal being equal to the inverse of the clock signal if the clock signal is in a high state, or equal to the clock signal if the clock signal is in a low state; and
    means for counting a number of edges of the counter signal to obtain a value of the digital signal.

11. The device according to claim 10, wherein the means for generating the counter signal comprises:
    means for generating a first control signal that is equal to a comparison signal based upon a result of the comparing;
    means for generating a second control signal that is equal to the inverse of the comparison signal;
    means for latching the clock signal in response to the first control signal;
    means for performing an EXCLUSIVE OR operation between the clock signal and the latched first control signal; and
    means for latching a result of the EXCLUSIVE OR operation in response to the second control signal.

12. The device according to claim 11, wherein the means for counting the number of edges of the counter signal comprises means for accounting a result of the latching of the result of the EXCLUSIVE OR operation.

13. The device according to claim 10, wherein the means for generating the rising voltage ramp comprises means for generating a first voltage ramp and a second voltage ramp.

14. A system comprising:
an image sensor comprising a matrix of rows and columns of pixels;
a charge transfer circuit, each column of pixels being connected to the charge transfer circuit; and
an analog-to-digital converter coupled to the charge transfer circuit so that a signal from each pixel of the column of pixels can be transferred from the charge transfer circuit to the analog-to-digital converter, wherein the analog-to-digital converter comprises:
  a clock generator configured to generate a clock signal;
  a ramp generator, configured to deliver a voltage ramp of increasing value;
  a comparator with a first input coupled to an output of the charge transfer circuit and a second input coupled to the output of the ramp generator, the comparator configured to generate a comparison signal of a first logical value when a value of the voltage ramp is the same as a value of a signal from the output of the charge transfer circuit;
  a signal generator coupled to an output the comparator and configured to generate a counter signal that is equal to the inverse of the clock signal if the comparison signal transitions to the first logical value while the clock signal is in a high state, and to generate a counter signal equal to the clock signal if the comparison signal transitions to the first logical value when the clock signal is in a low state; and
  a counter coupled to the signal generator to receive the counter signal, the counter configured to count a number of edges of the counter signal.

15. The system according to claim 14, wherein the signal generator comprises:
  a controller configured to generate a first control signal that is equal to the comparison signal and a second control signal that is equal to the inverse of the comparison signal;
  a first latch having a data input coupled to receive the clock signal and a control input coupled to receive the first control signal;
  an EXCLUSIVE OR logic gate having a first input coupled to an output of the first latch and a second input coupled to an output of the clock generator; and
  a second latch having a data input coupled to an output of the EXCLUSIVE OR logic gate and a control input coupled to the controller to receive the second control signal, the second latch having an output coupled to the counter.

16. The system according to claim 15, wherein the controller comprises the comparator and an inverter, the output of the comparator being coupled to the control input of the first latch and to an input of the inverter, and an output of the inverter being coupled to the control input of the second latch.

17. The system according to claim 16, wherein the ramp generator is configured to generate a first ramp and a second ramp, and wherein the controller further comprises a NAND logic gate and ramp detector configured to generate a signal having a high state during generation of the first ramp, the input of the inverter being coupled to the output of the comparator, the output of the inverter being coupled to a first input of the NAND logic gate and to the control input of the second latch, a second input of the NAND logic gate being coupled to the output of the ramp detector and an output of the NAND logic gate being coupled to the control input of the first latch.

18. The system according to claim 14, wherein the counter comprises an asynchronous counter.

19. The system according to claim 14, wherein the system is part of a digital camera.

20. The system according to claim 14, wherein the system is part of an intelligent mobile communications device.

\* \* \* \* \*

UNITED STATES PATENT AND TRADEMARK OFFICE
CERTIFICATE OF CORRECTION

PATENT NO. : 9,807,334 B1
APPLICATION NO. : 15/492139
DATED : October 31, 2017
INVENTOR(S) : Nicolas Moeneclaey

Page 1 of 1

It is certified that error appears in the above-identified patent and that said Letters Patent is hereby corrected as shown below:

On the Title Page

Item (73) Assignee, Line 1, delete "STMicoelectronics" and insert --STMicroelectronics--.

Signed and Sealed this
Twenty-third Day of January, 2018

Joseph Matal
*Performing the Functions and Duties of the*
*Under Secretary of Commerce for Intellectual Property and*
*Director of the United States Patent and Trademark Office*